United States Patent
Ormond et al.

(10) Patent No.: US 7,490,985 B2
(45) Date of Patent: Feb. 17, 2009

(54) SEMICONDUCTOR INTEGRATED CIRCUIT ARRANGEMENT DEVICE AND METHOD

(75) Inventors: Brian Ormond, Kanagawa (JP); Tomoki Umezawa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 487 days.

(21) Appl. No.: 11/204,020

(22) Filed: Aug. 16, 2005

(65) Prior Publication Data
US 2006/0211168 A1    Sep. 21, 2006

(30) Foreign Application Priority Data
Mar. 16, 2005    (JP) .............................. 2005-075597

(51) Int. Cl.
*A61B 6/08* (2006.01)
*G21K 5/00* (2006.01)
(52) U.S. Cl. .......................... 378/205; 378/34; 378/63; 378/206
(58) Field of Classification Search .................. 378/34, 378/63, 205, 206
See application file for complete search history.

(56) References Cited

U.S. PATENT DOCUMENTS

| | | | | |
|---|---|---|---|---|
| 3,742,229 A | * | 6/1973 | Smith et al. | ..................... 378/34 |
| 3,984,680 A | * | 10/1976 | Smith | ........................... 378/34 |
| 4,516,253 A | * | 5/1985 | Novak | ........................... 378/34 |
| 4,852,133 A | * | 7/1989 | Ikeda et al. | .................... 378/34 |
| 4,916,322 A | * | 4/1990 | Glavish et al. | ............ 250/492.2 |
| 5,590,170 A | * | 12/1996 | Zweig | ........................... 378/63 |
| 5,600,698 A | * | 2/1997 | Terashima et al. | ............. 378/34 |
| 5,760,881 A | * | 6/1998 | Miyazaki et al. | ................ 355/71 |
| 6,324,314 B1 | * | 11/2001 | Ukechi et al. | .................. 385/14 |
| 6,552,352 B2 | * | 4/2003 | Momose et al. | ........... 250/491.1 |
| 6,628,392 B2 | * | 9/2003 | Kuroda et al. | ................ 356/400 |
| 7,031,575 B2 | * | 4/2006 | Blauvelt et al. | ................ 385/39 |
| 7,193,232 B2 | * | 3/2007 | Lof et al. | ..................... 250/548 |
| 7,411,651 B2 | * | 8/2008 | Ostrom et al. | ................. 355/53 |

FOREIGN PATENT DOCUMENTS

JP        9-145965        6/1997

* cited by examiner

*Primary Examiner*—Edward J Glick
*Assistant Examiner*—Thomas R Artman
(74) *Attorney, Agent, or Firm*—Morgan, Lewis & Bockius LLP

(57) ABSTRACT

An arrangement device including: a photography section, which photographs a first mark and a second mark in a state in which a semiconductor integrated circuit to which the first mark is applied and a member to which the second mark is applied, which member is to be used in combination with the semiconductor integrated circuit, overlap; and a movement section, which relatively moves at least one of the semiconductor integrated circuit and the member with respect to the other thereof on the basis of positions of the first mark and the second mark which have been photographed by the photography section.

8 Claims, 13 Drawing Sheets

SEMICONDUCTOR INTEGRATED CIRCUIT ARRANGEMENT DEVICE AND METHOD

CROSS-REFERENCE TO RELATED APPLICATION

This application claims priority under 35 USC 119 from Japanese Patent Application No. 2005-075597, the disclosure of which is incorporated by reference herein.

BACKGROUND OF THE INVENTION

1. Field of the Invention

The present invention relates to an arrangement device and method, and more particularly relates to an arrangement device and method for arranging semiconductor integrated circuits at interposers and arranging semiconductor integrated circuit bodies at substrates.

2. Description of the Related Art

Conventionally, a semiconductor integrated circuit is arranged at an interposer, which is to intermediate between the semiconductor integrated circuit and a substrate, to configure a semiconductor integrated circuit body.

Then the semiconductor integrated circuit body is arranged at the substrate, and ultimately a package is fabricated.

In some cases, a light-emitting element for optical communication is provided at the semiconductor integrated circuit. Light of the optical communication passes through the interposer and is guided into an optical waveguide formed in the substrate. This light is guided to a light-receiving element at another semiconductor integrated circuit body arranged at the substrate. Thus, optical communication is performed.

For this optical communication, it is necessary to accurately arrange the semiconductor integrated circuit, the interposer and the substrate at pre-specified positions.

Heretofore, a method has been proposed for positioning at a time of superposition of an optical element with a substrate (see Japanese Patent Application Laid-Open (JP-A) No. 09-145965).

However, this positioning method is for superposing an optical element with a substrate, not for accurately arranging a semiconductor integrated circuit, an interposer and a substrate at pre-specified positions. Specifically, when a light-emitting element at a semiconductor integrated circuit is to be superposed with an optical waveguide at a substrate with an interposer being interposed therebetween, the interposer is an obstruction, so this is difficult.

SUMMARY OF THE INVENTION

The present invention has been made in view of the above circumstances, and provides an arrangement device and method which are capable of positioning a semiconductor integrated circuit and a substrate in a simple manner.

An arrangement device of a first aspect of the present invention is an arrangement device including: a photography section, which photographs a first mark and a second mark in a state in which a semiconductor integrated circuit to which the first mark is applied and a member to which the second mark is applied, which member is to be used in combination with the semiconductor integrated circuit, overlap; and a movement section, which relatively moves at least one of the semiconductor integrated circuit and the member with respect to the other thereof on the basis of positions of the first mark and the second mark which have been photographed by the photography section.

Firstly, for the invention described above, a case of positioning a semiconductor integrated circuit and a member (an interposer) will be described (i.e., a below-mentioned first movement).

First, in a state in which the semiconductor integrated circuit to which the first mark has been applied overlaps with the interposer which is to be employed in combination with the semiconductor integrated circuit and to which the second mark has been applied, the first mark and the second mark are photographed by the photography section.

Herein, this state in which the semiconductor integrated circuit and the member overlap may be a state in which the semiconductor integrated circuit and the member face one another with a predetermined separation therebetween, and may be a state in which the semiconductor integrated circuit and the interposer are superposed.

In accordance with the positions of the first mark and the second mark photographed by the photography section, the movement section relatively moves the at least one of the semiconductor integrated circuit and the member with respect to the other.

Now, the semiconductor integrated circuit is equipped with an optical communication device for performing optical communication, the interposer is equipped with a transparent member, which includes an optical system for focusing light for the optical communication, and the substrate is equipped with an optical waveguide, through which the light for optical communication will pass.

Positions of the first mark, the second mark and the third mark are specified such that, when light will pass through the interior of the optical waveguide for the optical communication, the complete distinguishing mark is formed.

After the semiconductor integrated circuit and the interposer have been positioned as described above, at least one of a body including the semiconductor integrated circuit with the interposer and the substrate is relatively moved with respect to the other such that, in images acquired by the photography, the distinguishing mark and the third mark get closer together and finally the pre-specified complete distinguishing mark is formed. Thus, even though the interposer is present, positioning of the semiconductor integrated circuit at the substrate can be performed with ease.

BRIEF DESCRIPTION OF THE DRAWINGS

Preferred embodiments of the present invention will be described in detail based on the following figures, wherein.

DETAILED DESCRIPTION OF THE INVENTION

Herebelow, an embodiment of the present invention will be described in detail with reference to the drawings.

Figure 1:
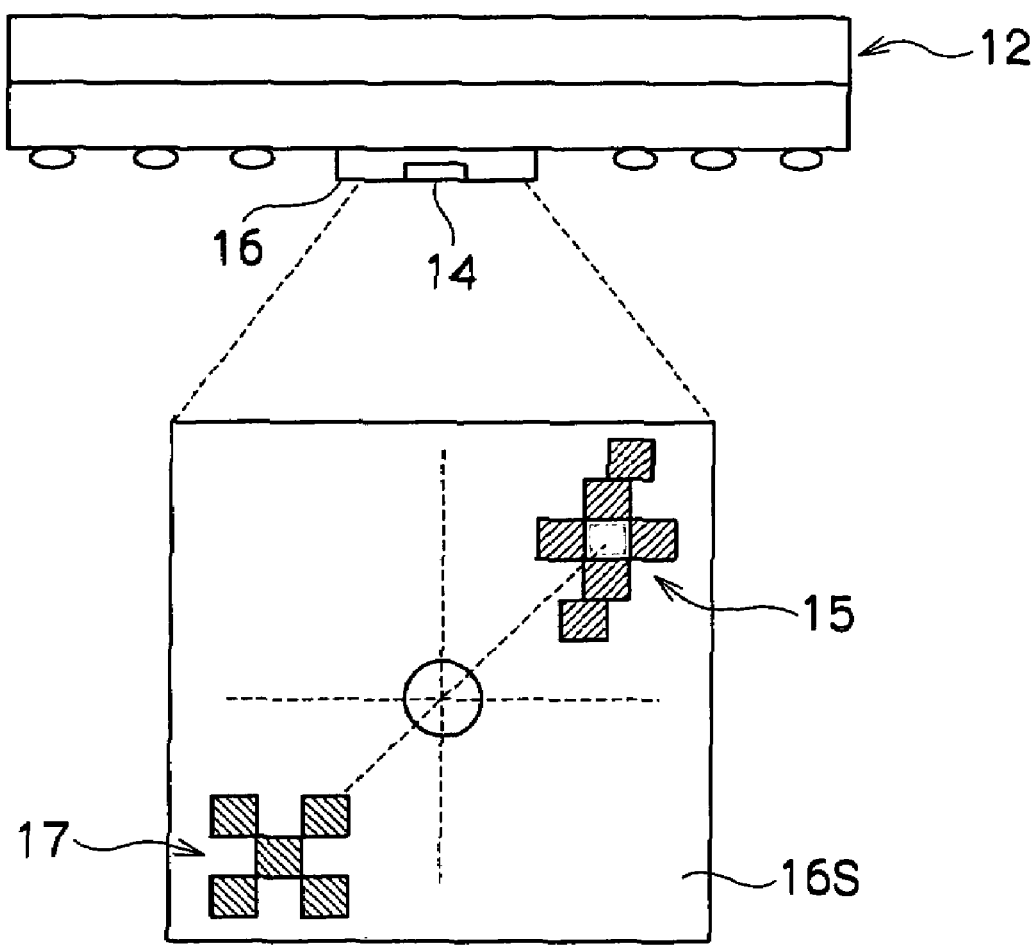
FIG. 1 is a view showing a semiconductor integrated circuit and a semiconductor integrated circuit mark which is applied to the semiconductor integrated circuit.

As shown in FIG. 1, a semiconductor integrated circuit 12 is equipped, at one face thereof, with an optical communication element 16. As the optical communication element 16, a light-emitting element (e.g., a VCSEL), a light detection element (e.g., a photodiode (PD)) or the like may be employed.

As will be discussed in more detail later, as reference points, a first semiconductor integrated circuit mark 15 and a second semiconductor integrated circuit mark 17 are applied in advance to an optical communication portion (a light-emitting portion or light-receiving portion) 14 at one face 16S of the optical communication element 16. Here, the first semiconductor integrated circuit mark 15 and the second semiconductor integrated circuit mark 17 are formed of a material which reflects X-rays.

Figure 2:
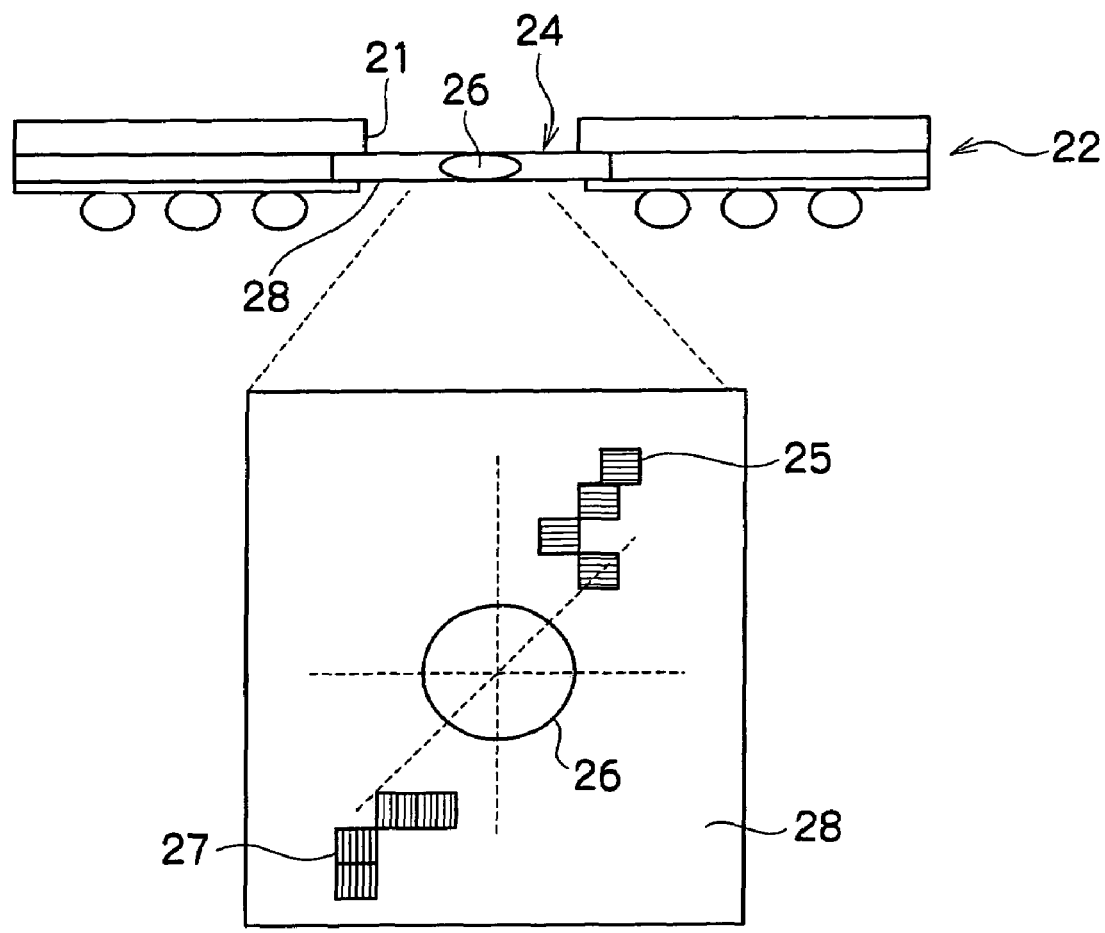
FIG. 2 is a view showing an interposer and a interposer mark which is applied to the interposer.

As shown in FIG. 2, at an interposer 22, which is interposed between the semiconductor integrated circuit 12 and a later-described substrate 50 (see FIG. 7), a through-hole 21 is formed. A transparent member 24, which is exposed by the through-hole, is provided at the through-hole 21. At the transparent member 24, an optical portion 26 is formed of a lens for focusing the light or the like. To form the optical portion 26, for example, laser ablation, etching, stamping or the like can be employed.

Here, if intensity of the light of optical communication will be large at the optical communication element 16, the optical portion 26 is not particularly necessary. However, when the optical portion 26 is formed, it is possible for the intensity of the light to be smaller, and an energy saving can be achieved.

As will be discussed in more detail later, as reference points, a first interposer mark 25 and a second interposer mark 27 are applied in advance to the optical portion 26 at one face 28 of the transparent member 24. Here, the first interposer mark 25 and the second interposer mark 27 are formed of a material which reflects X-rays.

Figure 3:
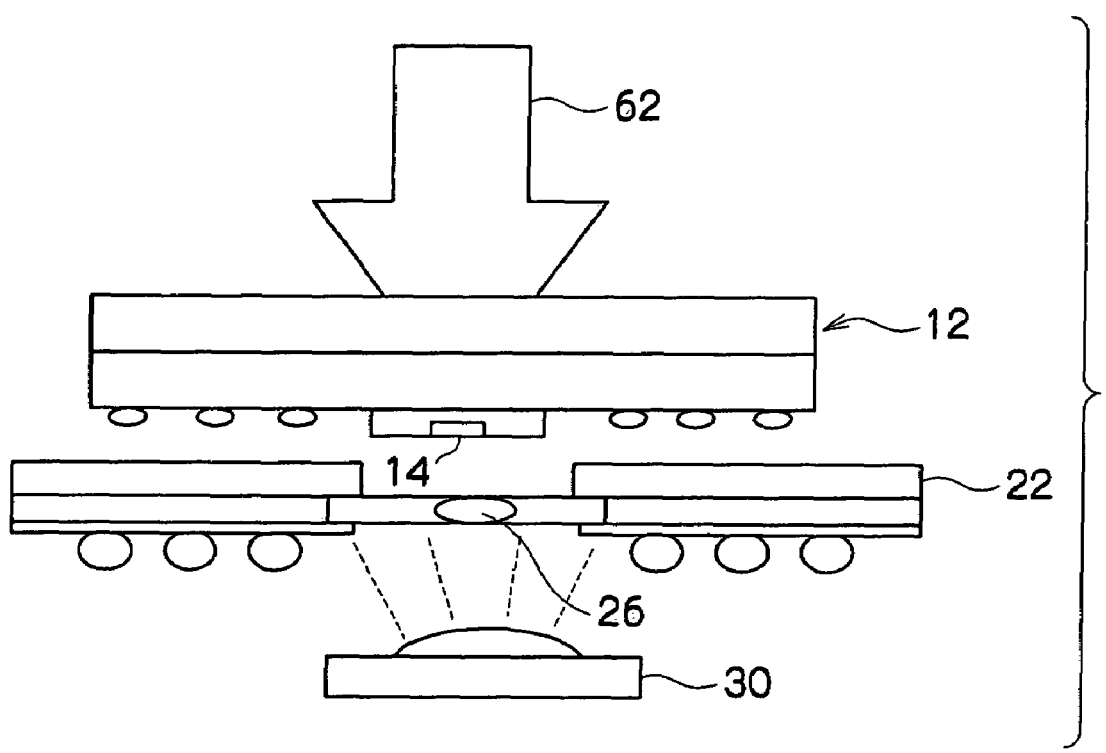
FIG. 3 is a view showing a state in which the semiconductor integrated circuit is being arranged at the interposer.

As shown in FIG. 3, in the present embodiment, the interposer 22 is arranged at the semiconductor integrated circuit 12. Next, an arrangement device for carrying out this operation will be described with reference to FIG. 10.

Figure 10:
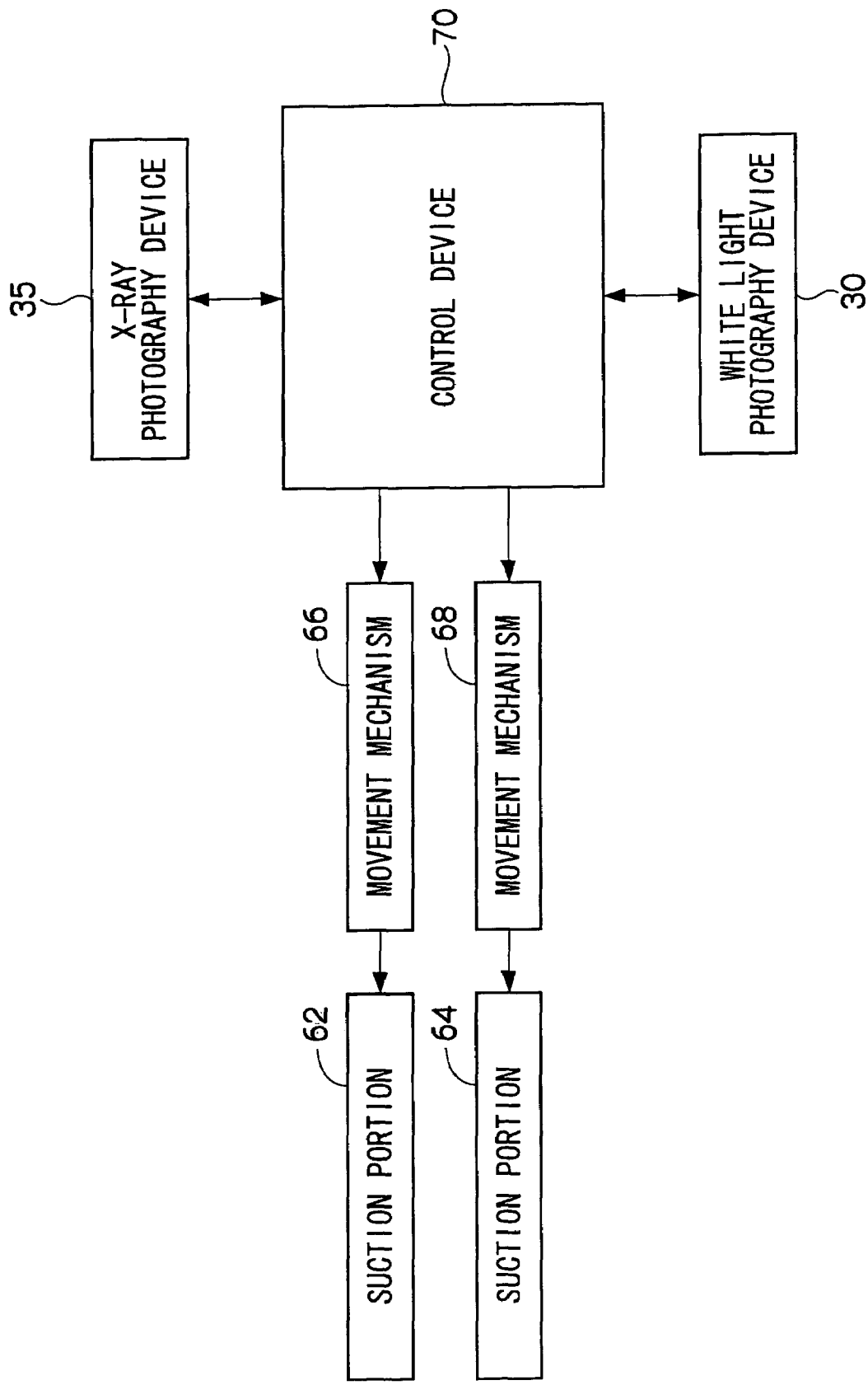
FIG. 10 is a block diagram of an arrangement device.

As shown in FIG. 10, the arrangement device is equipped with suction portions 62 and 64, which apply suction to and retain the semiconductor integrated circuit 12 (and a semiconductor integrated circuit body 40, which will be described later). The suction portion 62 and the suction portion 64 can be moved in three dimensions by a movement mechanism 66 and a movement mechanism 68, respectively. The movement mechanisms 66 and 68 are connected to a control device 70. A white light photography device 30 and an X-ray photography device 35 are also connected to the control device 70.

Figure 11:
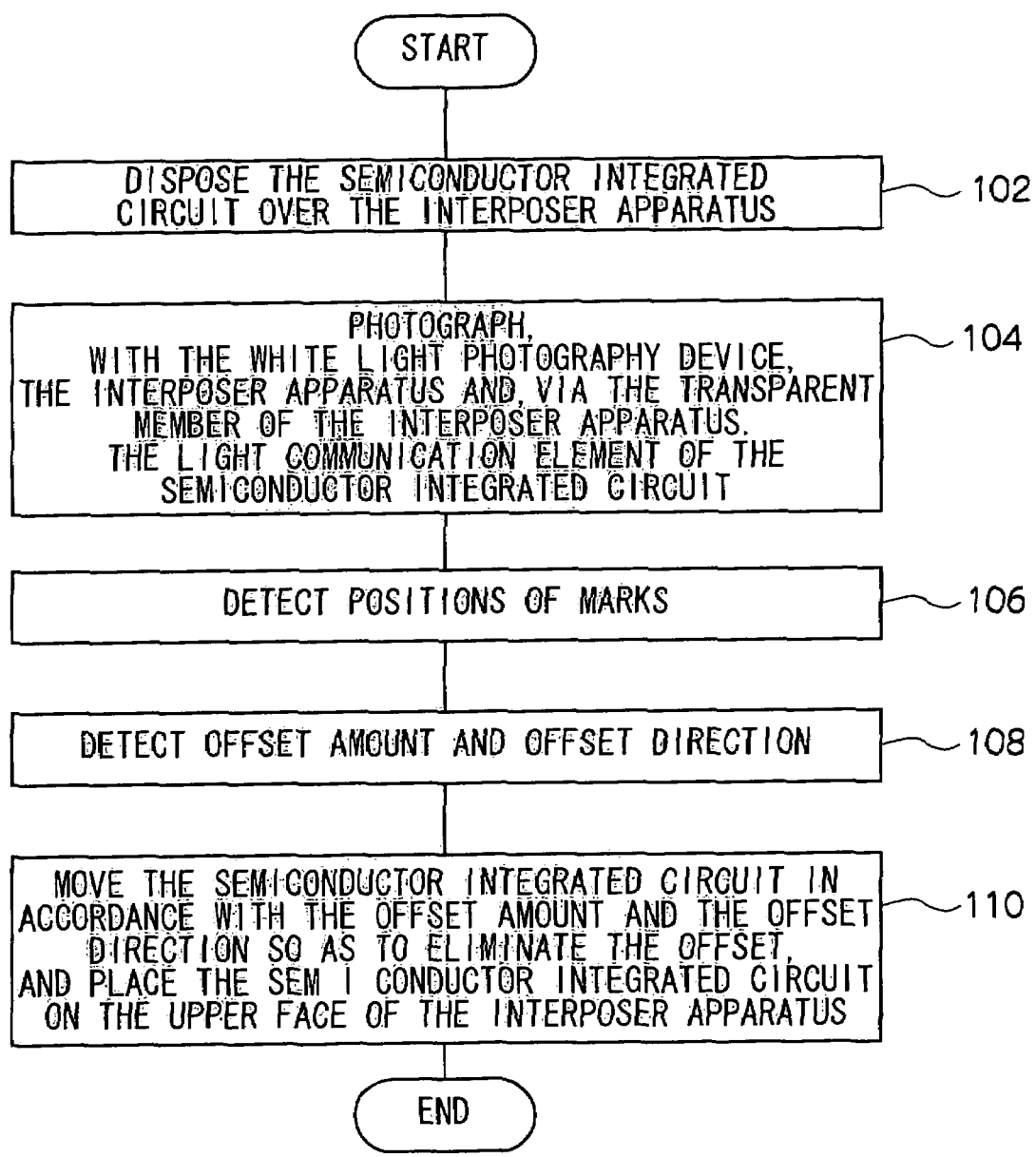
FIG. 11 is a chart showing a semiconductor integrated circuit-interposer-positioning processing routine.
Figure 12:
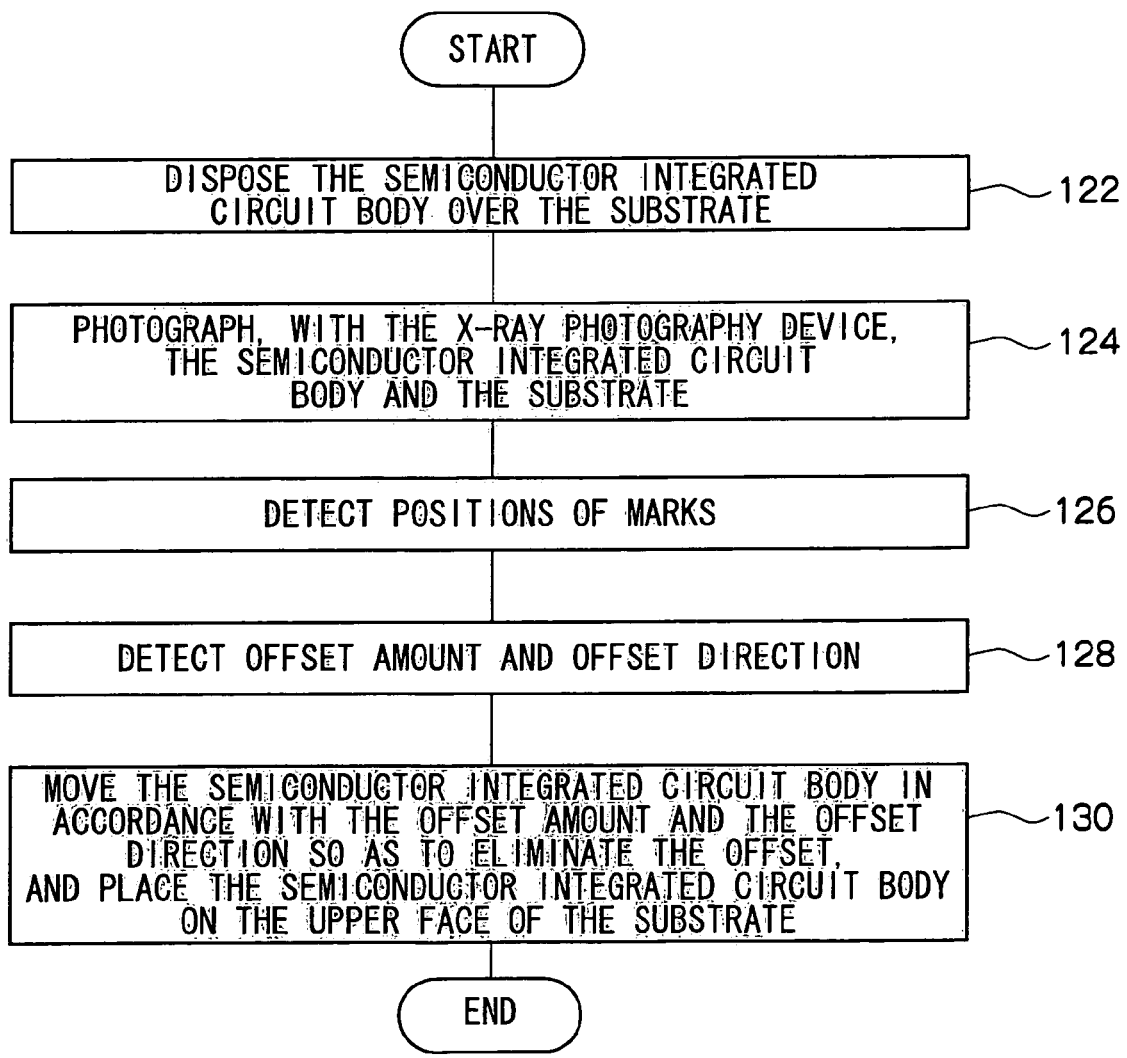
FIG. 12 is a chart showing a semiconductor integrated circuit body-substrate-positioning processing routine.

The control device 70 can be constituted by a computer, and is provided with a memory device which stores respective programs for a later-described semiconductor integrated circuit-interposer-positioning processing routine (see FIG. 11) and semiconductor integrated circuit body-substrate-positioning processing routine (see FIG. 12).

By controlling the movement mechanisms 66 and 68, the control device 70 can move the suction portions 62 and 64 in three dimensions, and can apply suction to and retain the semiconductor integrated circuit 12 (or the later-described semiconductor integrated circuit body 40).

Herein, a movement section is constituted by the suction portions 62 and 64 and the movement mechanisms 66 and 68, and a photography section is constituted by the white light photography device 30 and the X-ray photography device 35. Note that it is possible to provide the X-ray photography device 35 alone to serve as the photography section.

Next, processing for arranging the semiconductor integrated circuit 12 at the interposer 22 ((a first movement of) a method) will be described in accordance with a semiconductor integrated circuit-interposer-positioning processing routine flowchart (see FIG. 11).

When an unillustrated predetermined start button is set to 'on', the semiconductor integrated circuit-interposer-positioning processing routine starts. In step 102, as shown in FIG. 3, the semiconductor integrated circuit 12 is disposed above the interposer 22. Here, spatial co-ordinates (of start points and finish points) of the semiconductor integrated circuit 12 and the interposer 22, which are required for the processing of the present step 102, are stored in the memory device beforehand. In the present step 102, these spatial co-ordinates are read in and utilized, and thus the semiconductor integrated circuit 12 is disposed above the interposer 22.

In step 104, the interposer 22 and, via the transparent member 24 of the interposer 22, the optical communication element 16 of the semiconductor integrated circuit 12 are photographed by the white light photography device 30.

Here, the semiconductor integrated circuit marks 15 and 17 are disposed within a region which can be photographed by the white light photography device 30 via the transparent member 24.

Moreover, when the optical communication element 16 of the semiconductor integrated circuit 12 is photographed by the white light photography device 30 via the transparent member 24 of the interposer 22, the semiconductor integrated circuit marks 15 and 17 are photographed, and the interposer marks 25 and 27 are located inside the region of photography at this time.

Figure 4D:
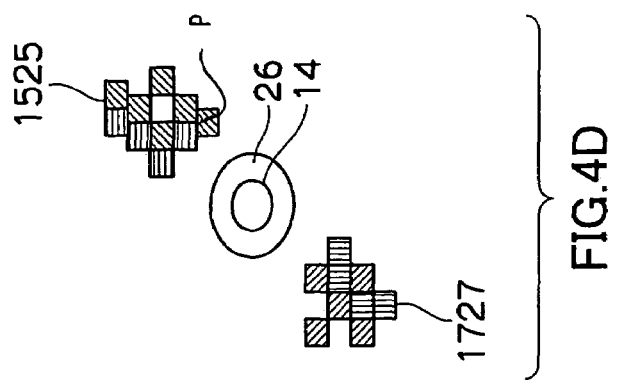
FIGS. 4A, 4B, 4C and 4D are views showing states when the semiconductor integrated circuit is being positioned at the interposer.
Figure 4C:
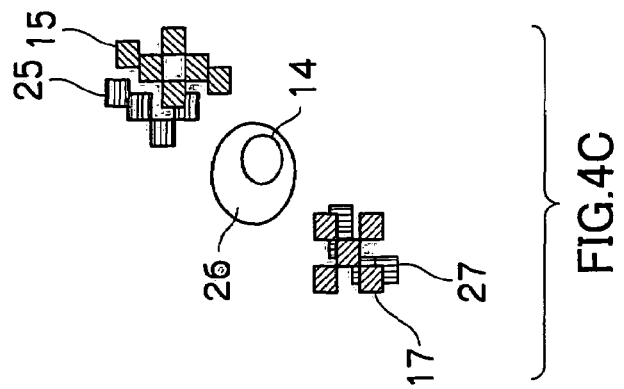
Figure 4B:
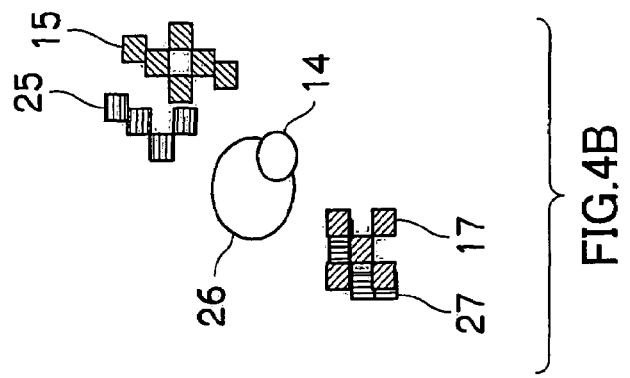
Figure 4A:
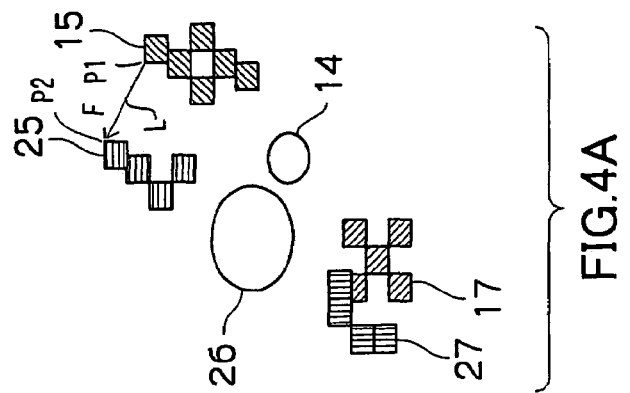

In step 106, on the basis of image data obtained by the photography, respective positions of the marks 15, 17, 25 and 27, as shown in FIG. 4A, are detected.

In step 108, an offset amount and an offset direction of the first semiconductor integrated circuit mark 15 and the first interposer mark 25 are detected.

Now, in the present embodiment, positions of the marks 15, 17, 25 and 27 are specified such that when a first optical axis, of the optical communication element 16, and a second optical axis, of the optical portion 26, are within a predetermined range of one another, for example, coinciding, a semiconductor integrated circuit body mark 1525 is formed by the first semiconductor integrated circuit mark 15 and the first interposer mark 25 and a semiconductor integrated circuit body mark 1727 is formed by the second semiconductor integrated circuit mark 17 and the second interposer mark 27, as shown in FIG. 4D. Note that the semiconductor integrated circuit body mark 1525 and the semiconductor integrated circuit body mark 1727 correspond to a complete mark, a first distinguishing mark and a distinguishing mark.

When, for example, the semiconductor integrated circuit body mark 1525 is formed, a pre-specified position P1 of the first semiconductor integrated circuit mark 15 and a pre-specified position P2 of the first interposer mark 25, which are shown in FIG. 4A, coincide at a point P, as shown in FIG. 4D.

Accordingly, in the present step 108, the offset amount is found in the form of a distance L between the pre-specified position P1 of the first semiconductor integrated circuit mark 15 and the pre-specified position P2 of the first interposer mark 25 shown in FIG. 4A. When the semiconductor integrated circuit 12 is disposed above the interposer 22 as mentioned above, the pre-specified position P2 of the first interposer mark 25 is a position which serves as a reference point. Accordingly, the offset direction F is a direction from the pre-specified position P2 of the first interposer mark 25 toward the pre-specified point P1 of the first semiconductor integrated circuit mark 15.

Figure 5:
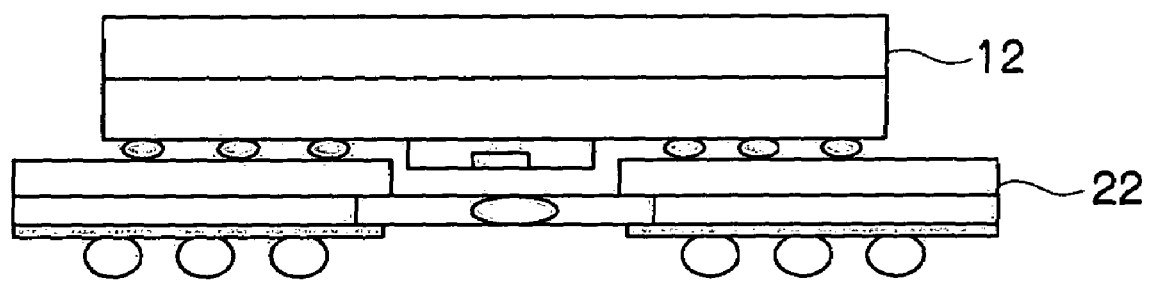
FIG. 5 is a view in which the semiconductor integrated circuit is arranged at the interposer.

In step 110, on the basis of the offset amount L and the offset direction F, the semiconductor integrated circuit 12 is moved so as to eliminate the offset, that is, such that the pre-specified position P1 of the first semiconductor integrated circuit mark 15 and the pre-specified position P2 of the first interposer mark 25 coincide at the point P as shown in FIG. 4D. More specifically, the semiconductor integrated circuit 12 is moved such that, in the image(s), the pre-specified position P1 of the first semiconductor integrated circuit mark 15 and the pre-specified position P2 of the first interposer mark 25 approach one another as shown in FIGS. 4A to 4D and finally the semiconductor integrated circuit body mark 1525 and the semiconductor integrated circuit body mark 1727 are formed, that is, such that the first optical axis of the optical communication element 16 and the second optical axis of the optical portion 26 coincide. Then, as shown in FIG. 5, the semiconductor integrated circuit 12 is placed on an upper face of the interposer 22.

Figure 6:
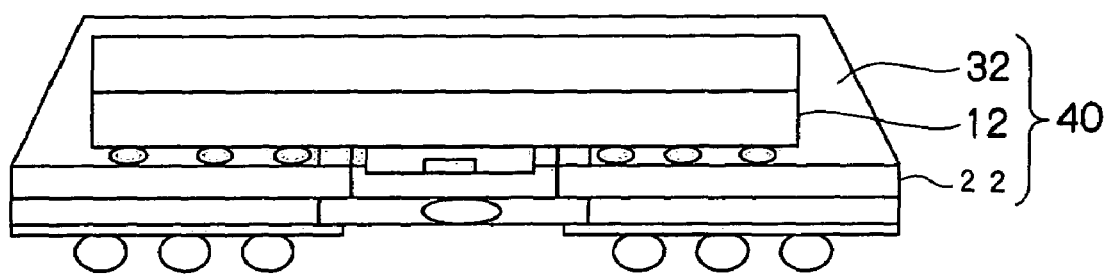
FIG. 6 is a view showing a semiconductor integrated circuit body.

Hence, as shown in FIG. 6, the semiconductor integrated circuit 12 and the interposer 22 are sealed with a sealant 32. Thus, the semiconductor integrated circuit body 40 is fabricated.

Thereafter, the semiconductor integrated circuit body 40 is arranged on the substrate 50. First, however, the substrate 50 will be described.

Figure 7:
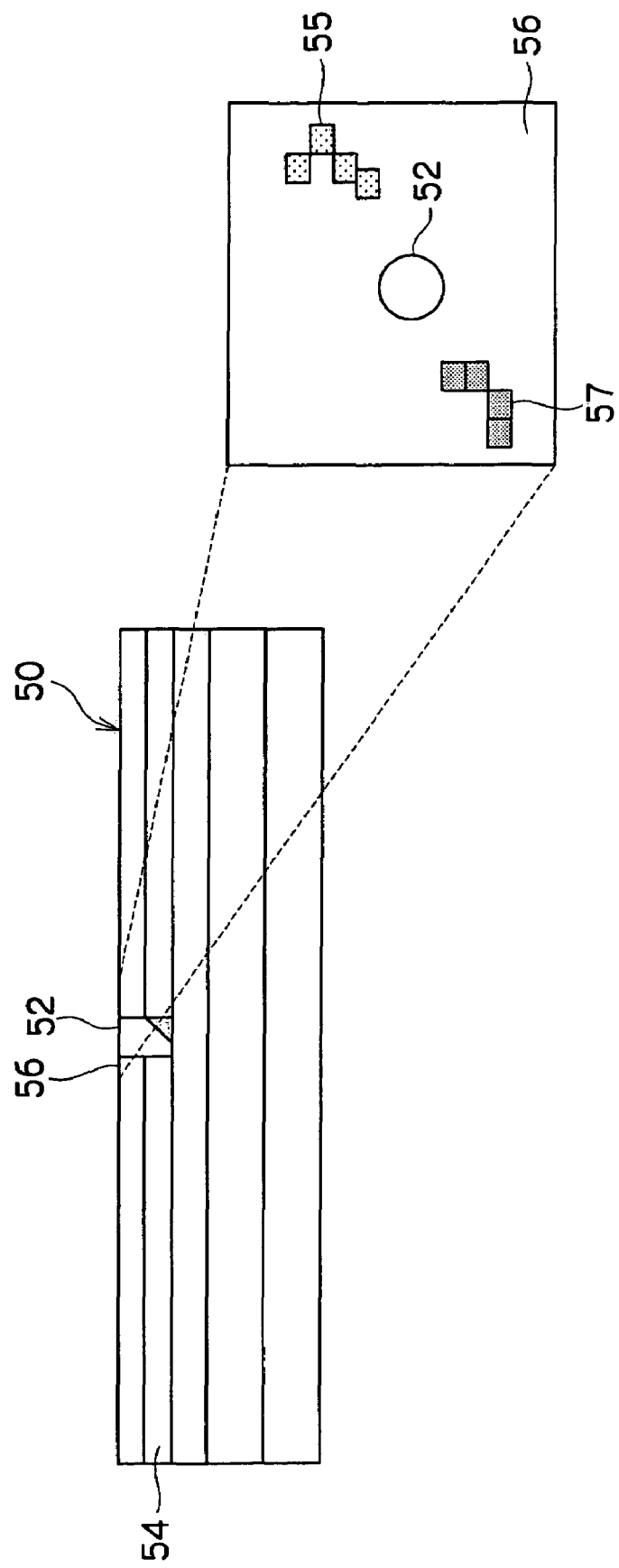
FIG. 7 is a view showing a substrate and a substrate mark which is applied to the substrate.

As shown in FIG. 7, the substrate 50 is provided with an optical waveguide 54 thereinside. Two ends of the optical waveguide 54 are respectively located at an upper face of the substrate 50 (one at a position of the semiconductor integrated circuit body 40). Note that, of the two ends of the optical waveguide 54, only one end 52 is shown in FIG. 7.

In a vicinity of the one end 52 of the optical waveguide 54, substrate marks 55 and 57 are formed. Here, the substrate marks 55 and 57 are formed of a material which reflects X-rays.

Next, processing for arranging the semiconductor integrated circuit body 40 at the substrate 50 ((a second movement of) the method) will be described in accordance with a semiconductor integrated circuit body-substrate-positioning processing routine flowchart (see FIG. 12).

Figure 8:
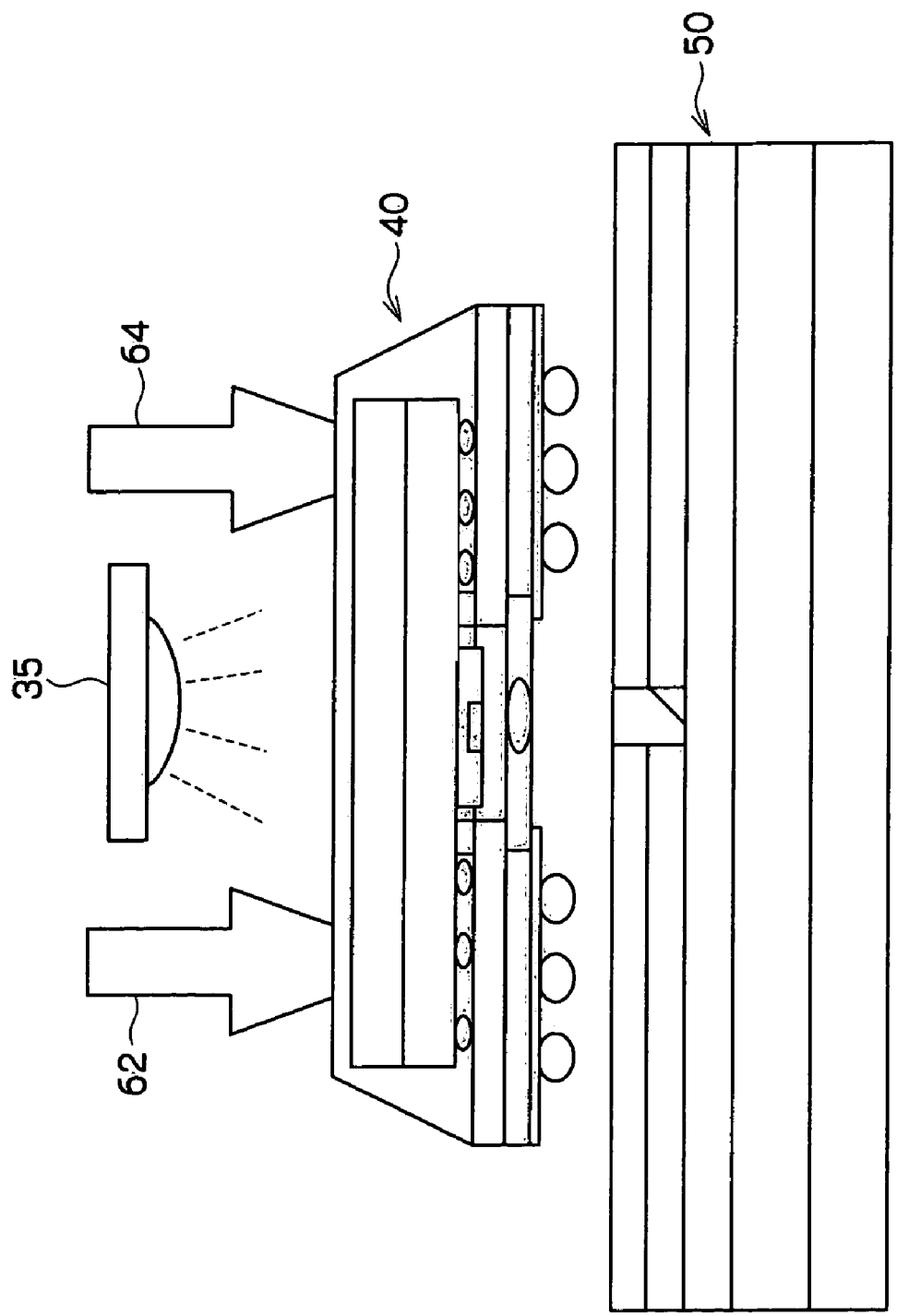
FIG. 8 is a view showing a state in which the semiconductor integrated circuit body is being arranged at the substrate.

When an unillustrated predetermined start button is set to 'on', the semiconductor integrated circuit body-substrate-positioning processing routine starts. In step 122, as shown in FIG. 8, the semiconductor integrated circuit body 40 is disposed above the substrate 50. Here, spatial co-ordinates (of start points and finish points) of the semiconductor integrated circuit body 40 and the substrate 50, which are required for the processing of the present step 122, are stored in the memory device beforehand. In the present step 122, these spatial co-ordinates are read in and utilized, and thus the semiconductor integrated circuit body 40 is disposed above the substrate 50.

In step 124, the semiconductor integrated circuit body 40 and the substrate 50 are photographed by the X-ray photography device 35.

Figure 9:
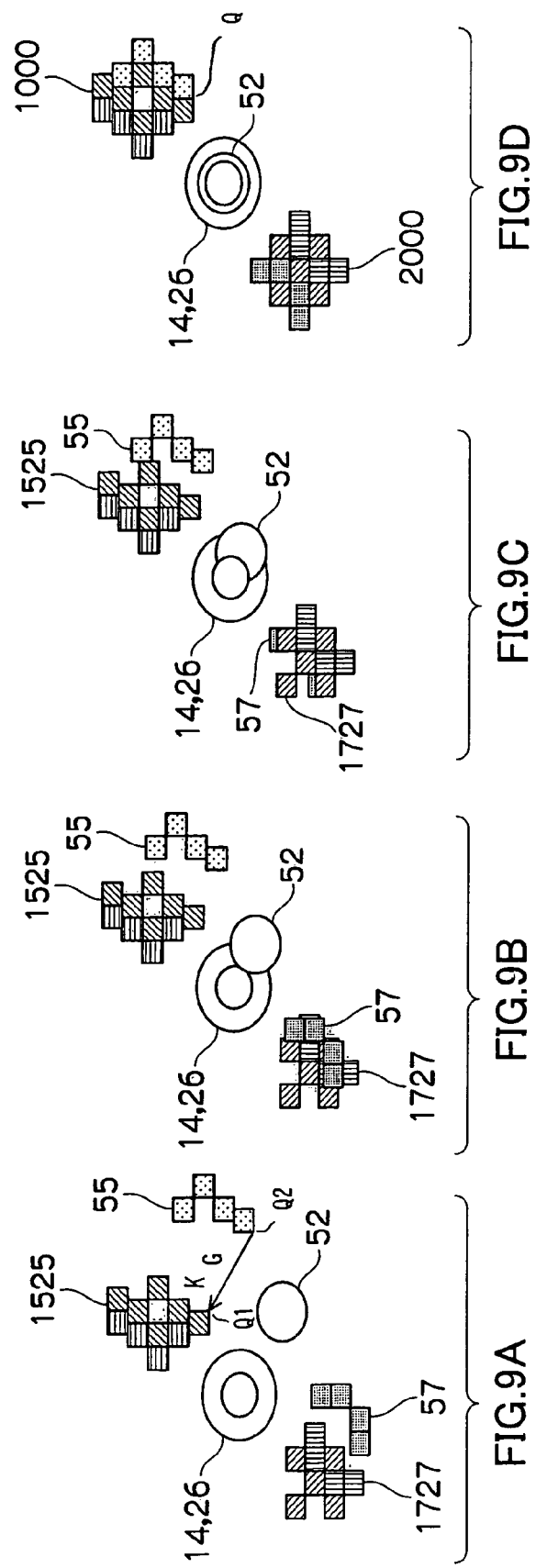
FIGS. 9A, 9B, 9C and 9D are views showing states when the semiconductor integrated circuit body is being positioned at the substrate.

In step 126, on the basis of image data obtained by this photography, respective positions of the marks 1517, 2527, 55 and 57, as shown in FIG. 9A, are detected.

In step 128, an offset amount and an offset direction of the semiconductor integrated circuit body mark 1525 and the substrate mark 55 are detected.

Now, in the present embodiment, positions of the marks 1525, 1727, 55 and 57 are specified such that when light of optical communication from the optical communication element 16 will pass into the one end 52 at the semiconductor integrated circuit body 40 end of the optical waveguide 54, a package mark 1000 is formed by the semiconductor integrated circuit body mark 1525 and the substrate mark 55 and a package mark 2000 is formed by the semiconductor integrated circuit body mark 1727 and the substrate mark 57, as shown in FIG. 9D. Note that the package mark 1000 and the package mark 2000 correspond to a complete distinguishing mark.

When, for example, the package mark 1000 is formed, a pre-specified position Q1 of the semiconductor integrated circuit body mark 1525 and a pre-specified position Q2 of the substrate mark 55, which are shown in FIG. 9A, coincide at a point Q, as shown in FIG. 9D.

Accordingly, in the present step 128, the offset amount is found in the form of a distance G between the pre-specified position Q1 of the semiconductor integrated circuit body mark 1525 and the pre-specified position Q2 of the substrate mark 55 shown in FIG. 9A. When the semiconductor integrated circuit body 40 is disposed above the non-moving substrate 50 as mentioned above, the pre-specified position Q2 of the substrate mark 55 is a position which serves as a reference point. Accordingly, the offset direction K is a direction from the pre-specified point Q2 of the substrate mark 55 toward the pre-specified point Q1 of the semiconductor integrated circuit body mark 1525.

In step 130, on the basis of the offset amount G and the offset direction K, the semiconductor integrated circuit body 40 is moved so as to eliminate the offset, that is, such that the pre-specified position Q1 of the semiconductor integrated circuit body mark 1525 and the pre-specified position Q2 of the substrate mark 55 coincide at the point Q as shown in FIG. 9D. More specifically, the semiconductor integrated circuit body 40 is moved such that, in the image(s), the pre-specified position Q1 of the semiconductor integrated circuit body mark 1525 and the pre-specified position Q2 of the substrate mark 55 approach one another as shown in FIGS. 9A to 9D and finally the package marks 1000 and 2000 are formed, that is, such that light of optical communication of the optical communication element 16 will be guided inside the one end 52 at the semiconductor integrated circuit body 40 end of the optical waveguide 54. Then, the semiconductor integrated circuit body 40 is placed on an upper face of the substrate 50 and fixed, and a package (a semiconductor integrated circuit device) is fabricated.

As has been described above, in the present embodiment, the positioning of the semiconductor integrated circuit and the interposer is performed, and then the semiconductor integrated circuit body is moved relative to the substrate such that the semiconductor integrated circuit body mark and the substrate mark in the image(s) obtained by photography are brought together and finally a pre-specified package mark is formed. Thus, even though the interposer is present, it is possible to perform positioning of the semiconductor integrated circuit at the substrate simply.

Figure 13C:
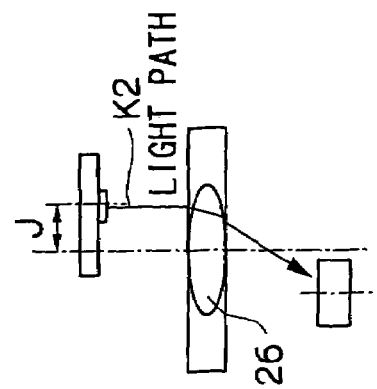
FIGS. 13A, 13B and 13C are views for explaining a variant example for when a semiconductor integrated circuit is being arranged at a substrate.
Figure 13B:
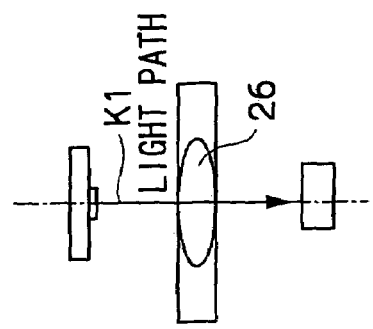
Figure 13A:
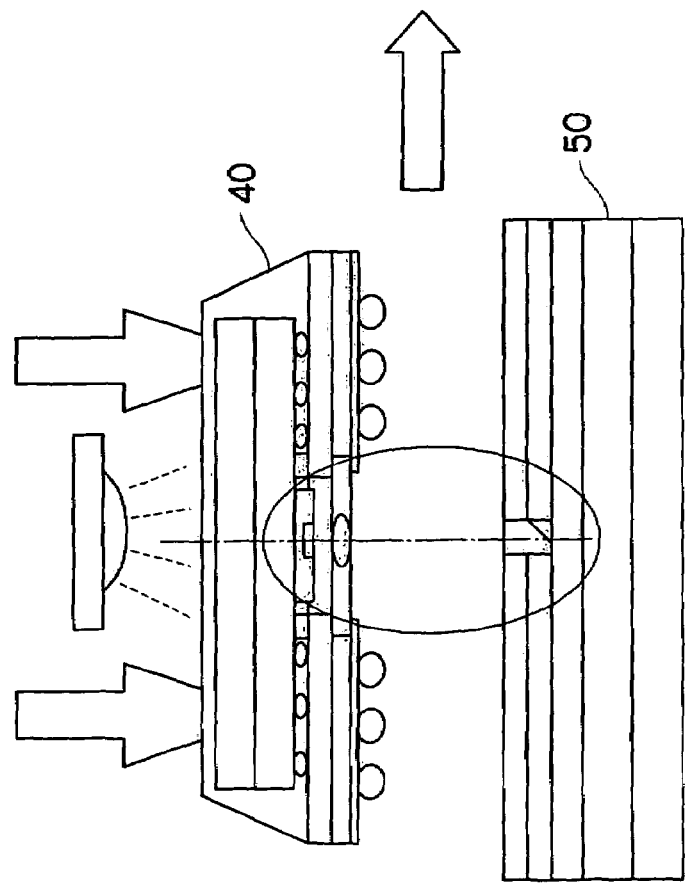

In the embodiment described above, the semiconductor integrated circuit 12 is moved and placed on the upper face of the interposer 22 such that the first optical axis of the optical communication element 16 and the second optical axis of the optical portion 26 coincide (a light path K1), as shown in FIG. 13B. However, the present invention is not limited thus. It is also possible to detect an offset amount J between the first optical axis of the optical communication element 16 (a light path K2) and the second optical axis of the optical portion 26, and on the basis of this detected offset amount, to move the semiconductor integrated circuit body 40 relative to the substrate 50 such that light of optical communication of the optical communication element 16 is guided inside the one end 52 of the optical waveguide 54.

When, in this manner, the offset amount between the first optical axis of the optical communication element 16 and the second optical axis of the optical portion 26 is detected and the semiconductor integrated circuit body 40 is moved relative to the substrate 50 on the basis of the detected offset amount, there is no need to position the semiconductor integrated circuit 12 at the interposer 22 accurately. Thus, positioning of the semiconductor integrated circuit at the substrate can be performed even more simply.

In such a case, the offset amount is detected on the basis of the pre-specified position Q1 of the semiconductor integrated circuit body mark 1525 and the pre-specified position Q2 of the substrate mark 55, which are detected on the basis of the image(s) obtained by the photography, and the semiconductor integrated circuit body 40 is moved relative to the substrate 50 such that a package mark which is determined in accordance with this offset amount is formed.

Here, the complete distinguishing mark mentioned above is not invariable, but is specified in accordance with an offset amount in order that light of optical communication of the optical communication element 16 will be guided inside the one end 52 of the optical waveguide 54.

Now, in the example described above, the photography is performed as described earlier, the pre-specified position Q1 of the semiconductor integrated circuit body mark 1525 and the pre-specified position Q2 of the substrate mark 55 are detected on the basis of the image obtained by the photography, and the offset amount is detected on the basis of the detected pre-specified positions Q1 and Q2. However, the present invention is not limited thus. A light detector may be provided at the other end of the optical waveguide 54, and the offset amount may be detected on the basis of light amounts that are sensed by this light detector.

Further, because a certain amount of error can be tolerated between positions of arrangement of the semiconductor integrated circuit and the interposer, rather than applying the marks to both the semiconductor integrated circuit and the interposer, it is possible to apply a mark to only one of the semiconductor integrated circuit and the interposer, and to move the semiconductor integrated circuit body in accordance with this mark and the substrate mark.

In the embodiment described above, the respective marks of the semiconductor integrated circuit, the interposer and the substrate are at different locations. Consequently, depending on photography conditions, one or other of focusing points may be shifted, and it may not be possible to reliably detect the offset amount.

Accordingly, in such a case, when the marks of the semiconductor integrated circuit, the interposer and the substrate are to be photographed, it is possible to obtain respective sets of image data which are focused at the locations of the respective marks of the semiconductor integrated circuit, the interposer and the substrate, to find the positions of the respective marks on the basis of the respective sets of image data, and hence to detect the offset amount.

Herein, the semiconductor integrated circuit is moved relative to the interposer. However, it is also possible to move the interposer relative to the semiconductor integrated circuit, and to move both the semiconductor integrated circuit and the interposer body. Further, although the semiconductor integrated circuit body is moved relative to the substrate, it is also possible to move the substrate relative to the semiconductor integrated circuit body, and to move both the semiconductor integrated circuit body and the substrate.

Now, a movement section may relatively move at least one of the semiconductor integrated circuit and the interposer with respect to the other such that a first mark and a second mark approach one another in an image obtained by photography and finally form a pre-specified complete mark (distinguishing mark).

To be specific, a movement amount and a movement direction for relatively moving the at least one of the semiconductor integrated circuit and the interposer relative to the other in order to form the complete mark are calculated on the basis of positions of the first mark and the second mark, and the at least one of the semiconductor integrated circuit and the interposer body is relatively moved with respect to the other in accordance with the movement amount and movement direction that have been found by the calculation.

Further, in a case in which the semiconductor integrated circuit is provided with an optical communication element for performing optical communication and a member to which a second mark is applied is provided with a transparent member including an optical system for focusing light for the optical communication, a movement section may relatively move at least one of the semiconductor integrated circuit and the member with respect to the other such that a first optical axis, of the optical communication element, and a second optical axis, of the optical system, are disposed within a predetermined range of one another.

On the other hand, the semiconductor integrated circuit may be provided with an optical communication element for performing optical communication, a member to which a second mark is applied may be provided with a transparent member including an optical system for focusing light for the optical communication, and positions of the first mark and the second mark may be specified such that the complete mark is formed when a first optical axis, of the optical communication element, and a second optical axis, of the optical system, are disposed within a predetermined range of one another.

In such cases, a photography section photographs the first mark via the transparent member, the first mark is disposed within a region which can be photographed by the photography section via the transparent member, and the second mark is disposed within a region of photography of when the photography section photographs the first mark.

Please note that the present invention may includes various aspects other than the aspect described above.

An arrangement device of a second aspect of the present invention may be an arrangement device including: a photography section, which photographs a first mark, a second mark and a third mark in a state in which a semiconductor integrated circuit to which the first mark is applied, an interposer to which the second mark is applied and a substrate to which the third mark is applied overlap, the interposer being for interposing between the semiconductor integrated circuit and the substrate; and a movement section, which relatively moves at least one of the semiconductor integrated circuit, the interposer and the substrate with respect to the others thereof on the basis of positions of the first mark, the second mark and the third mark which have been photographed by the photography section.

Herein, relatively moving the one of the combination of the semiconductor integrated circuit with the interposer and the substrate with respect to the other after the semiconductor integrated circuit and the interposer have been positioned is not a limitation.

That is, an arrangement device of a third aspect of the present invention may include: a photography section, which photographs a first distinguishing mark and a second distinguishing mark in a state in which a semiconductor integrated circuit body to which the first distinguishing mark is applied and a substrate to which the second distinguishing mark is applied overlap, the semiconductor integrated circuit body including a semiconductor integrated circuit and an interposer which is to be interposed between the semiconductor integrated circuit and the substrate; and a movement section, which relatively moves at least one of the semiconductor integrated circuit body and the substrate with respect to the other thereof on the basis of positions of the first distinguishing mark and the second distinguishing mark which have been photographed by the photography section.

In other words, in a state in which the semiconductor integrated circuit body to which the first distinguishing mark has been applied, in which the semiconductor integrated circuit and the interposer to be interposed between the semiconductor integrated circuit and the substrate are provided, overlaps with the substrate to which the second distinguishing mark has been applied, the first distinguishing mark and the second distinguishing mark are photographed by the photography section.

That is, the semiconductor integrated circuit body includes the semiconductor integrated circuit and the interposer, and the first distinguishing mark is applied thereto.

Here, the first distinguishing mark may be applied to one or other of the semiconductor integrated circuit and the interposer, or may be a complete mark which is formed in the image by the first mark and the second mark, as mentioned earlier.

The second distinguishing mark (which corresponds to the third mark) is applied to the substrate.

The photography section photographs the first distinguishing mark and the second distinguishing mark in the state in which the semiconductor integrated circuit and the interposer overlap.

Then, in accordance with the positions of the first distinguishing mark and the second distinguishing mark photographed by the photography section, the movement section relatively moves at least one of the semiconductor integrated circuit body and the substrate with respect to the other.

An arrangement device of another aspect of the present invention may include: a movement section, which relatively moves and arranges at least one of a semiconductor integrated circuit body and a substrate with respect to the other thereof, the semiconductor integrated circuit body including a semiconductor integrated circuit which includes an optical communication element for performing optical communication and an interposer which is to be interposed between the semiconductor integrated circuit and the substrate, a through-hole being provided in the interposer and the interposer including, at the through-hole, a transparent member which includes an optical system for focusing light for the optical communication, and the substrate including an optical waveguide, through which light of optical communication passes; and a detection section, which detects an offset amount between a first optical axis, of the optical communication element, and a second optical axis, of the optical system, wherein the movement section relatively moves the at least one of the semiconductor integrated circuit body and the substrate with respect to the other on the basis of the offset amount which has been detected by the detection section.

In other words, the aspect is an arrangement device which performs the arrangement by relatively moving the at least one of the semiconductor integrated circuit body and the substrate with respect to the other.

Here, the semiconductor integrated circuit body is provided with the semiconductor integrated circuit and the interposer.

The semiconductor integrated circuit is provided with an optical communication element for optical communication.

The interposer is for intermediating between the semiconductor integrated circuit and the substrate. The through-hole is formed in the interposer and the interposer is provided, at the through-hole, with the transparent member including the optical system, which focuses light for the optical communication.

In the present invention, an offset amount between the first optical axis of the optical communication element and the second optical axis of the optical system is detected. In accordance with the detected offset amount, at least one of the semiconductor integrated circuit body and the substrate is relatively moved with respect to the other.

Because the offset amount between the first optical axis of the optical communication element and the second optical axis of the optical system is detected and the one of the semiconductor integrated circuit body and the substrate is relatively moved with respect to the other on the basis of this detected offset amount, it is not necessary to accurately position the semiconductor integrated circuit and the interposer and, even though the interposer is present, accurate positioning of the semiconductor integrated circuit with the substrate can be performed more simply.

As described above, the complete distinguishing mark is specified in accordance with the offset amount. That is, an arrangement position of the semiconductor integrated circuit body with the substrate is determined on the basis of the detected offset amount, and the complete distinguishing mark is determined on the basis of this arrangement position.

A still another aspect of the present invention is an arrangement method including: relatively moving and arranging at least one of a semiconductor integrated circuit body and a substrate with respect to the other thereof, the semiconductor integrated circuit body including a semiconductor integrated circuit which includes an optical communication element for performing optical communication and an interposer which is to be interposed between the semiconductor integrated circuit and the substrate, the interposer including a transparent member which includes an optical system for focusing light for the optical communication, and the substrate including an optical waveguide, through which light of optical communication passes; and detecting an offset amount between a first optical axis, of the optical communication element, and a second optical axis, of the optical system, wherein the step of moving includes relatively moving the at least one of the semiconductor integrated circuit body and the substrate with respect to the other on the basis of the offset amount which has been detected in the detecting.

Herein, an invention which is a semiconductor integrated circuit device fabrication method for fabricating a semiconductor integrated circuit device with the arrangement device of any of the aspects of the present invention described above, an invention which is a semiconductor integrated circuit device fabrication method for fabricating a semiconductor integrated circuit device by carrying out an arrangement method of any of the other aspects, and suchlike may be proposed.

The present invention as described above is capable of performing positioning of a semiconductor integrated circuit at a substrate simply, even when an interposer is present.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An arrangement device comprising:
a movement section, which relatively moves and arranges at least one of a semiconductor integrated circuit body and a substrate with respect to the other thereof, the semiconductor integrated circuit body including
a semiconductor integrated circuit which includes an optical communication element for performing optical communication and
an interposer which is to be interposed between the semiconductor integrated circuit and the substrate, a throughhole being provided in the interposer and the interposer including, at the through-hole, a transparent member which includes an optical system for focusing light for the optical communication, and
the substrate including an optical waveguide, through which light of optical communication passes; and
a detection section, which detects an offset amount between a first optical axis, of the optical communication element, and a second optical axis, of the optical system,
wherein the movement section relatively moves the at least one of the semiconductor integrated circuit body and the substrate with respect to the other on the basis of the offset amount which has been detected by the detection section.

2. The arrangement device of claim 1, wherein
a first distinguishing mark has been applied beforehand to the semiconductor integrated circuit body and a second distinguishing mark has been applied beforehand to the substrate,
the arrangement device further includes a photography section, which photographs the first distinguishing mark and the second distinguishing mark,
the detection section detects the offset amount on the basis of positions of the first distinguishing mark and second distinguishing mark photographed by the photography section, and
the movement section relatively moves the at least one of the semiconductor integrated circuit body and the substrate with respect to the other such that the first distinguishing mark and the second distinguishing mark approach one another in an image obtained by the photography and form a complete distinguishing mark which is determined in accordance with the offset amount.

3. An arrangement method comprising:
relatively moving and arranging at least one of a semiconductor integrated circuit body and a substrate with respect to the other thereof the semiconductor integrated circuit body including
a semiconductor integrated circuit which includes an optical communication element for performing optical communication and
an interposer which is to be interposed between the semiconductor integrated circuit and the substrate, the interposer including a transparent member which includes an optical system for focusing light for the optical communication, and
the substrate including an optical waveguide, through which light of optical communication passes; and
detecting an offset amount between a first optical axis, of the optical communication element, and a second optical axis, of the optical system,
wherein the step of moving includes relatively moving the at least one of the semiconductor integrated circuit body and the substrate with respect to the other on the basis of the offlet amount which has been detected in the detecting.

4. The arrangement method of claim 3, wherein
a first distinguishing mark has been applied beforehand to the semiconductor integrated circuit body and a second distinguishing mark has been applied beforehand to the substrate,
the arrangement method further includes the step of photographing the first distinguishing mark and the second distinguishing mark,
the step of detecting includes detecting the offset amount on the basis of positions of the first distinguishing mark and second distinguishing mark photographed in the photographing and
the step of moving includes relatively moving the at least one of the semiconductor integrated circuit body and the substrate with respect to the other such that the first distinguishing mark and the second distinguishing mark approach one another in an image obtained by the step of photographing and form a complete distinguishing mark which is determined in accordance with the offset amount.

5. An arrangement device comprising:
a photography section, which photographs a first mark, a second mark and a third mark in a state in which a semiconductor integrated circuit to which the first mark is applied, an interposer to which the second mark is applied and a substrate to which the third mark is applied overlap, the interposer being for interposing between the semiconductor integrated circuit and the substrate; and
a movement section, which relatively moves at least one of the semiconductor integrated circuit, the interposer and the substrate with respect to the others thereof on the basis of positions of the first mark, the second mark and the third mark which have been photographed by the photography section so that the first mark, the second mark, and the third mark come close to each other to form a complete mark and the semiconductor integrated circuit and the substrate become combined in a pre-specified position, wherein the movement section performs at least
a first movement, for relatively moving at least one of the semiconductor integrated circuit and the interposer with respect to the other thereof such that the first mark and the second mark approach one another in an image obtained by the photography and form a pre-specified distinguishing mark, and a second movement, for relatively moving at least one of a body including the semiconductor integrated circuit with the interposer and the substrate with respect to the other thereof such that the distinguishing mark and the third mark approach one another in an image obtained by the photography and finally form a pre-specified complete distinguishing mark.

6. An arrangement device comprising:

a photography section, which photographs a first mark, a second mark and a third mark in a state in which a semiconductor integrated circuit to which the first mark is applied, an interposer to which the second mark is applied and a substrate to which the third mark is applied overlap, the interposer being for interposing between the semiconductor integrated circuit and the substrate; and a movement section, which relatively moves at least one of the semiconductor integrated circuit, the interposer and the substrate with respect to the others thereof on the basis of positions of the first mark, the second mark and the third mark which have been photographed by the photography section so that the first mark, the second mark, and the third mark come close to each other to form a complete mark and the semiconductor integrated circuit and the substrate become combined in a pre-specified position, wherein the movement section performs at least a first movement, for relatively moving at least one of the semiconductor integrated circuit and the interposer with respect to the other thereof such that the first mark and the second mark approach one another in an image obtained by the photography and form a pre-specified distinguishing mark, and a second movement, for relatively moving at least one of a body including the semiconductor integrated circuit with the interposer and the substrate with respect to the other thereof such that the distinguishing mark and the third mark approach one another in an image obtained by the photography and finally form a pre-specified complete distinguishing mark, wherein the first mark, the second mark and the third mark are reflective of X-rays, and for photographing the distinguishing mark and the third mark, the photography section employs X-rays and passes the X-rays through at least one of the substrate and the body including the semiconductor integrated circuit with the interposer.

7. An arrangement method comprising the steps of photographing a first mark, a second mark and a third mark in a state in which a semiconductor integrated circuit to which the first mark is applied, an interposer to which the second mark is applied and a substrate to which the third mark is applied overlap, the interposer being for interposing between the semiconductor integrated circuit and the substrate; and relatively moving at least one of the semiconductor integrated circuit, the interposer and the substrate with respect to the others thereof on the basis of positions of the first mark, the second mark and the third mark which have been photographed in the photographing so that the first mark, the second mark, and the third mark com close to each other to form a complete mark and the semiconductor integrated circuit and the substrate become combined in a pre-specified position, wherein the step of moving comprises:

relatively moving at least one of the semiconductor integrated circuit and the interposer with respect to the other thereof such that the first mark and the second mark approach one another in an image obtained by the photography and form a pre-specified distinguishing mark, and relatively moving at least one of a body including the semiconductor integrated circuit with the interposer and the substrate with respect to the other thereof such that the distinguishing mark and the third mark approach one another in an image obtained by the photography and finally form a pre-specified complete distinguishing mark.

8. An arrangement method comprising the steps of photographing a first mark, a second mark and a third mark in a state in which a semiconductor integrated circuit to which the first mark is applied, an interposer to which the second mark is applied and a substrate to which the third mark is applied overlap, the interposer being for interposing between the semiconductor integrated circuit and the substrate: and relatively moving at least one of the semiconductor integrated circuit, the interposer and the substrate with respect to the others thereof on the basis of positions of the first mark, the second mark and the third mark which have been photographed in the photographing so that the first mark, the second mark, and the third mark com close to each other to form a complete mark and the semiconductor integrated circuit and the substrate become combined in a pre-specified position, wherein the step of moving comprises:

relatively moving at least one of the semiconductor integrated circuit and the interposer with respect to the other thereof such that the first mark and the second mark approach one another in an image obtained by the photography and form a pre-specified distinguishing mark, and relatively moving at least one of a body including the semiconductor integrated circuit with the interposer and the substrate with respect to the other thereof such that the distinguishing mark and the third mark approach one another in an image obtained by the photography and finally form a pre-specified complete distinguishing mark, and wherein the first mark, the second mark and the third mark are reflective of X-rays, and the step of photographing includes employing X-rays and transmitting the X-rays through at least one of the substrate and the body including the semiconductor integrated circuit with the interposer for photographing the distinguishing mark and the third mark.

* * * * *